(12) United States Patent
Nakanishi et al.

(10) Patent No.: US 12,041,788 B2
(45) Date of Patent: Jul. 16, 2024

(54) STORAGE DEVICE AND METHOD FOR MANUFACTURING STORAGE DEVICE

(71) Applicant: Kioxia Corporation, Tokyo (JP)

(72) Inventors: Tsutomu Nakanishi, Kanagawa (JP); Yasuaki Ootera, Kanagawa (JP); Nobuyuki Umetsu, Kanagawa (JP); Michael Arnaud Quinsat, Kanagawa (JP); Masaki Kado, Kanagawa (JP); Susumu Hashimoto, Tokyo (JP); Shiho Nakamura, Kanagawa (JP); Naoharu Shimomura, Tokyo (JP); Tsuyoshi Kondo, Kanagawa (JP); Mutsumi Okajima, Mie (JP)

(73) Assignee: Kioxia Corporation, Tokyo (JP)

(*) Notice: Subject to any disclaimer, the term of this patent is extended or adjusted under 35 U.S.C. 154(b) by 397 days.

(21) Appl. No.: 17/467,095

(22) Filed: Sep. 3, 2021

(65) Prior Publication Data
US 2022/0302208 A1 Sep. 22, 2022

(30) Foreign Application Priority Data
Mar. 18, 2021 (JP) .................................. 2021-044935

(51) Int. Cl.
*H10B 61/00* (2023.01)
*H10N 50/01* (2023.01)
(Continued)

(52) U.S. Cl.
CPC ............. *H10B 61/22* (2023.02); *H10N 50/01* (2023.02); *H10N 50/10* (2023.02); *H10N 50/80* (2023.02)

(58) Field of Classification Search
None
See application file for complete search history.

(56) References Cited

U.S. PATENT DOCUMENTS

| 8,133,753 | B2 | 3/2012 | Kohyama |
| 9,385,067 | B2 | 7/2016 | Nakamura |

(Continued)

FOREIGN PATENT DOCUMENTS

| JP | 4561265 B2 | 10/2010 |
| JP | 5568969 B2 | 8/2014 |

OTHER PUBLICATIONS

Laura K. Acosta, et al. "Tunable Nanoporous Anodic Alumina Photonic Crystals by Gaussian Pulse Anodization," ACS Appl. Mater, Interfaces,, vol. 12, pp. 19778-19787 (2020).

*Primary Examiner* — Bo B Jang
(74) *Attorney, Agent, or Firm* — Finnegan, Henderson, Farabow, Garrett & Dunner, LLP

(57) ABSTRACT

A storage device includes: a memory unit and a first pillar. The first pillar includes: a first region having a third portion between a first and a second portion respectively having a first and a second maximum diameter, and having a first minimum diameter, the first and second portions defining a first distance; a second region having a sixth portion between a fourth and a fifth portion respectively having a third and a fourth maximum diameter, and having a second minimum diameter, the fourth and fifth portions defining a second distance; and a third region between the first and second regions, having a ninth portion between a seventh and an eighth portion respectively having a fifth and a sixth maximum diameter, and having a third minimum diameter, the seventh and eighth portions defining a third distance shorter than each of the first and second distances.

16 Claims, 15 Drawing Sheets

(51) Int. Cl.
*H10N 50/10* (2023.01)
*H10N 50/80* (2023.01)

(56) References Cited

U.S. PATENT DOCUMENTS

| | | |
|---|---|---|
| 10,249,665 B2 | 4/2019 | Yamamoto et al. |
| 2011/0127629 A1 | 6/2011 | Yorikado et al. |
| 2015/0380638 A1* | 12/2015 | Ootera ............... G11C 11/1675 257/421 |
| 2020/0091182 A1 | 3/2020 | Shishido et al. |

* cited by examiner

STORAGE DEVICE AND METHOD FOR MANUFACTURING STORAGE DEVICE

CROSS-REFERENCE TO RELATED APPLICATION

This application is based upon and claims the benefit of priority from Japanese Patent Application No. 2021-044935, filed on Mar. 18, 2021; the entire contents of which are incorporated herein by reference.

FIELD

Embodiments described herein relate generally to a storage device and a method for manufacturing the storage device.

BACKGROUND

A memory with a three-dimensional structure has been developed to further increase capacity of the memory. An example of the memory with the three-dimensional structure includes a semiconductor device manufactured by forming a memory cell array and then forming elements on upper and lower surfaces of the memory cell array.

DETAILED DESCRIPTION

Figure 1:
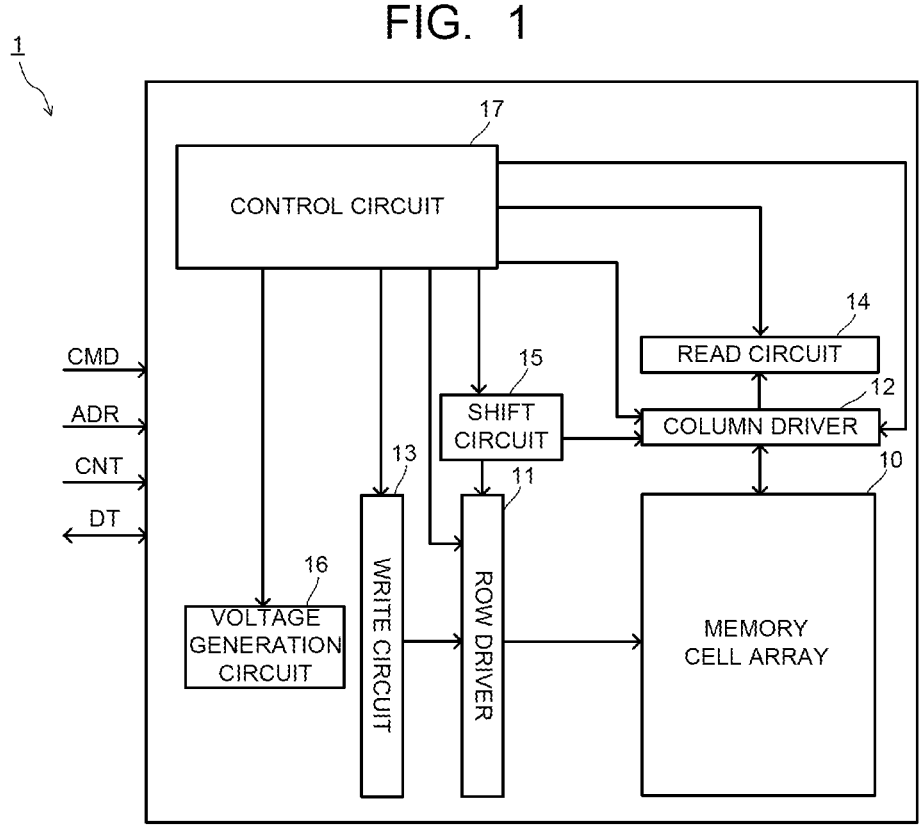
FIG. 1 is a block diagram illustrating a configuration example of a storage device.

A storage device of an embodiment includes: an insulating layer including a first surface, a second surface, a first insulating region provided between the first and second surfaces, and a second insulating region provided between the first and second surfaces; at least one memory unit provided in the first insulating region; at least one first pillar provided in the second insulating region and extending in a first direction intersecting the first and second surfaces; a first element provided on the first surface side of the insulating layer; and a second element provided on the second surface side of the insulating layer. The at least one first pillar includes: a first region including a first portion, a second portion and a third portion, the first portion having a first maximum diameter, the second portion having a second maximum diameter, the third portion being provided between the first and second portions in the first direction adjacent to each of the first and second portions and having a first minimum diameter, and the first and second portions defining a first distance therebetween in the first direction; a second region including a fourth portion, a fifth portion and a sixth portion, the fourth portion having a third maximum diameter, the fifth portion having a fourth maximum diameter, the sixth portion being provided between the fourth and fifth portions in the first direction adjacent to each of the fourth and fifth portions and having a second minimum diameter, and the fourth and fifth portions defining a second distance therebetween in the first direction; and a third region provided between the first and second regions in the first direction and including a seventh portion, an eighth portion and a ninth portion, the seventh portion having a fifth maximum diameter, the eighth portion having a sixth maximum diameter, the ninth portion provided between the seventh and eighth portions in the first direction adjacent to each of the seventh and eighth portions and having a third minimum diameter, the seventh and eighth portions defining a third distance therebetween in the first direction, and the third distance being shorter than each of the first and second distances.

Hereinafter, embodiments will be described with reference to the drawings. A relationship between a thickness and a planar size of each component, a thickness proportion of each component, and the like illustrated in the drawings are sometimes different from actual ones. In each embodiment presented below, substantially the same components are denoted by the same reference signs, and a description thereof is sometimes partially omitted.

In this specification, "connection" includes not only physical connection but also electrical connection, unless otherwise specified.

FIG. 1 is a block diagram illustrating a configuration example of a storage device. FIG. 1 illustrates a storage device 1, which is a magnetic domain wall memory. The storage device 1 includes a memory cell array 10, a row driver 11, a column driver 12, a write circuit 13, a read circuit 14, a shift circuit 15, a voltage generation circuit 16, and a control circuit 17.

Figure 2:
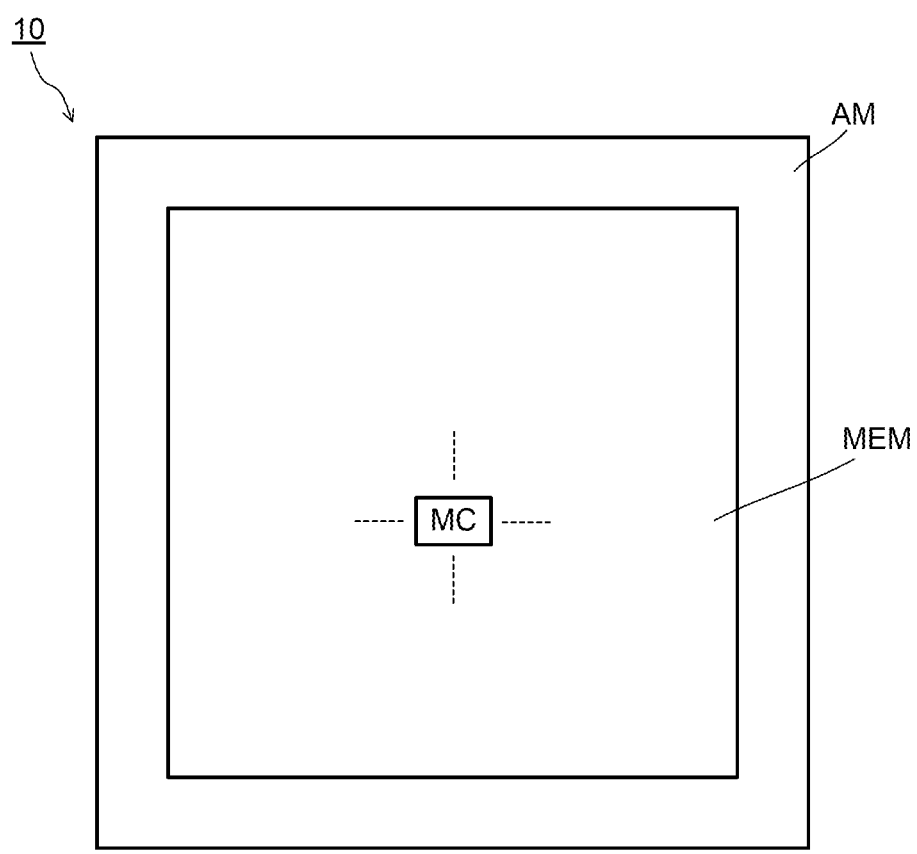
FIG. 2 is a block diagram illustrating a configuration example of a memory cell array.

FIG. 2 is a block diagram illustrating a configuration example of the memory cell array 10. The memory cell array 10 has a memory cell region MEM including a plurality of memory cells MC and an alignment mark region AM. Each of the memory cells MC is connected to a corresponding word line WL and bit line BL. Data is stored in the memory cell MC.

The row driver 11 controls a plurality of rows of the memory cell array 10. The row driver 11 receives a row address signal based on a decoding result of an address signal ADR input from outside from the control circuit 17. The row driver 11 sets the word line WL of a row selected by the row address signal to a selected state. The row driver 11 has circuits such as, for example, a multiplexer (word line selection circuit) and a word line driver.

The column driver 12 controls a plurality of columns of the memory cell array 10. The column driver 12 receives a column address signal based on the decoding result of the address signal ADR from the control circuit 17. The column driver 12 sets the bit line BL of a column selected by the column address signal to a selected state. The column driver 12 has circuits such as, for example, a multiplexer (bit line selection circuit) and a bit line driver.

The write circuit 13 performs various controls for data write operations. The write circuit 13 receives a data signal DT input from outside. The write circuit 13 supplies write pulses formed by current and/or voltage to the memory cell array 10 during the write operation. This allows data to be written to the memory cells MC. The write circuit 13 is electrically connected to the memory cell array 10 through the row driver 11. The write circuit 13 has circuits such as, for example, a voltage source and/or a current source, a pulse generation circuit, and a latch circuit.

The read circuit 14 performs various controls for data read operations. The read circuit 14 supplies read pulses (for example, read current) to the memory cell array 10 during the read operation. The read circuit 14 senses a potential or current value of the bit line BL. Based on this sense result, data in the memory cell MC can be read out. The read circuit 14 transfers read data signals to the outside. The read circuit 14 is connected to the memory cell array 10 through the column driver 12. The read circuit 14 has circuits such as, for example, a voltage source and/or a current source, a pulse generation circuit, a latch circuit, and a sense amplifier circuit.

The shift circuit 15 performs various controls for shift operations (data shifting). The shift circuit 15 supplies pulses (hereinafter, referred to as shift pulses) to the memory cell array 10 to move magnetic domain walls (magnetic domains) in magnetic substances provided in the memory cells MC during the shift operation. The shift circuit 15 is connected to the memory cell array 10 through the row driver 11 and the column driver 12. The shift circuit 15 has circuits such as, for example, a voltage source and/or a current source, and a pulse generation circuit.

The write circuit 13, the read circuit 14, and the shift circuit 15 are not limited to mutually independent circuits. For example, the write circuit 13, the read circuit 14, and the shift circuit 15 may be arranged in the storage device 1 as a single integrated circuit with common components that can be used mutually.

The voltage generation circuit 16 generates voltages for various operations of the memory cell array 10 using a power supply voltage supplied from outside. The voltage generation circuit 16 supplies the generated various voltages to each of the row driver 11, the column driver 12, the write circuit 13, the read circuit 14, and the shift circuit 15.

The control circuit 17 has, for example, a command register and an address register. The control circuit 17 controls the row driver 11, the column driver 12, the write circuit 13, the read circuit 14, the shift circuit 15, and the voltage generation circuit 16 based on a command signal CMD, the address signal ADR, and a control signal CNT input from outside, for example, to perform operations such as read operations, write operations, and erase operations.

The command signal CMD is a signal that indicates operations to be performed by the storage device 1. For example, the address signal ADR is a signal that indicates coordinates of one or more memory cells MC to be operated in the memory cell array 10 (hereinafter, referred to as selected cells). The address signal ADR includes the row address signal and the column address signal of the memory cell MC. The control signal CNT is a signal for controlling, for example, an operation timing between the storage device 1 and an external device and an internal operation timing of the storage device 1.

Figure 3:
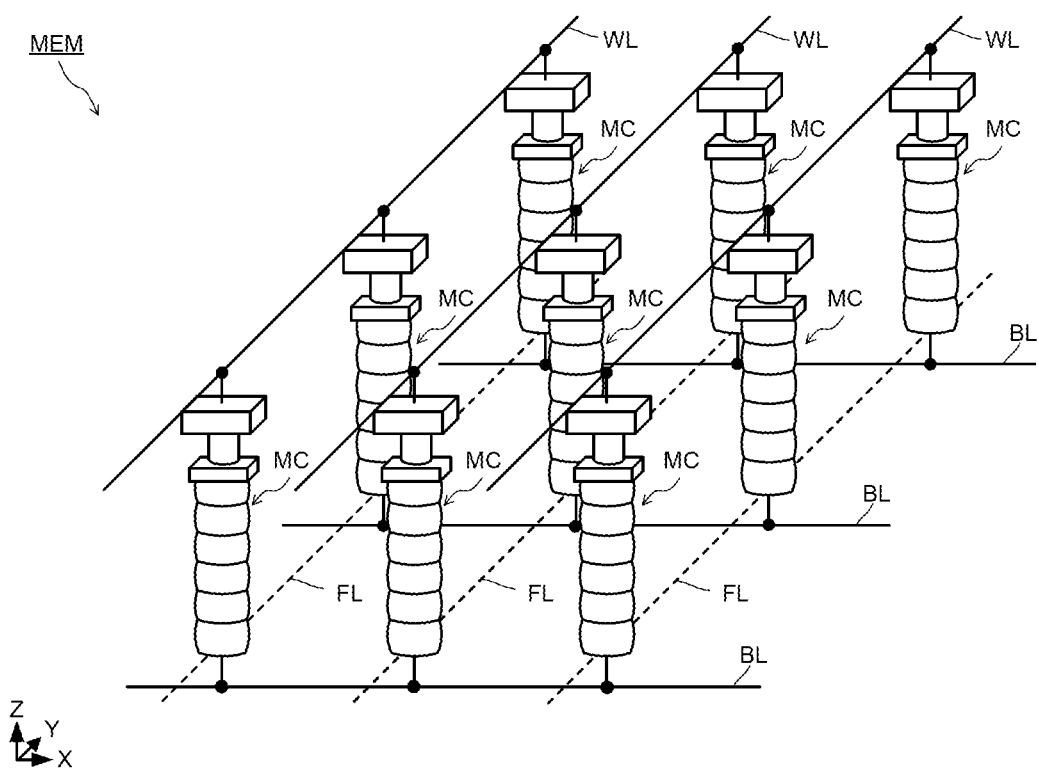
FIG. 3 is a schematic diagram illustrating a configuration example of a memory cell region.

FIG. 3 is a schematic diagram illustrating a configuration example of the memory cell region MEM. FIG. 3 illustrates an X-axis, a Y-axis intersecting perpendicularly to the X-axis, and a Z-axis intersecting perpendicularly to each of the X-axis and Y-axis.

The memory cell region MEM has the plurality of memory cells MC arranged two-dimensionally. Each of the plurality of memory cells MC is electrically connected to one of the plurality of word lines WL and one of the plurality of bit lines BL. The plurality of word lines WL are arranged in the X-axis direction. The word line WL extends in the Y-axis direction. The plurality of bit lines BL are arranged in the Y-axis direction. The bit line BL extends in the X-axis direction.

The memory cell MC is provided between the word line WL and the bit line BL. One end of the memory cell MC is connected to the word line WL. The other end of the memory cell MC is connected to the bit line BL. The plurality of memory cells MC arranged in the Y-axis direction are connected to the same word line WL. Memory cells MC arranged in the X-axis direction are connected to the common bit line BL.

The word line WL is electrically connected to the row driver 11. A state of the word line WL is controlled by the row driver 11.

The bit line BL is electrically connected to the column driver 12. A state of the bit line BL is controlled by the column driver 12.

Figure 4:
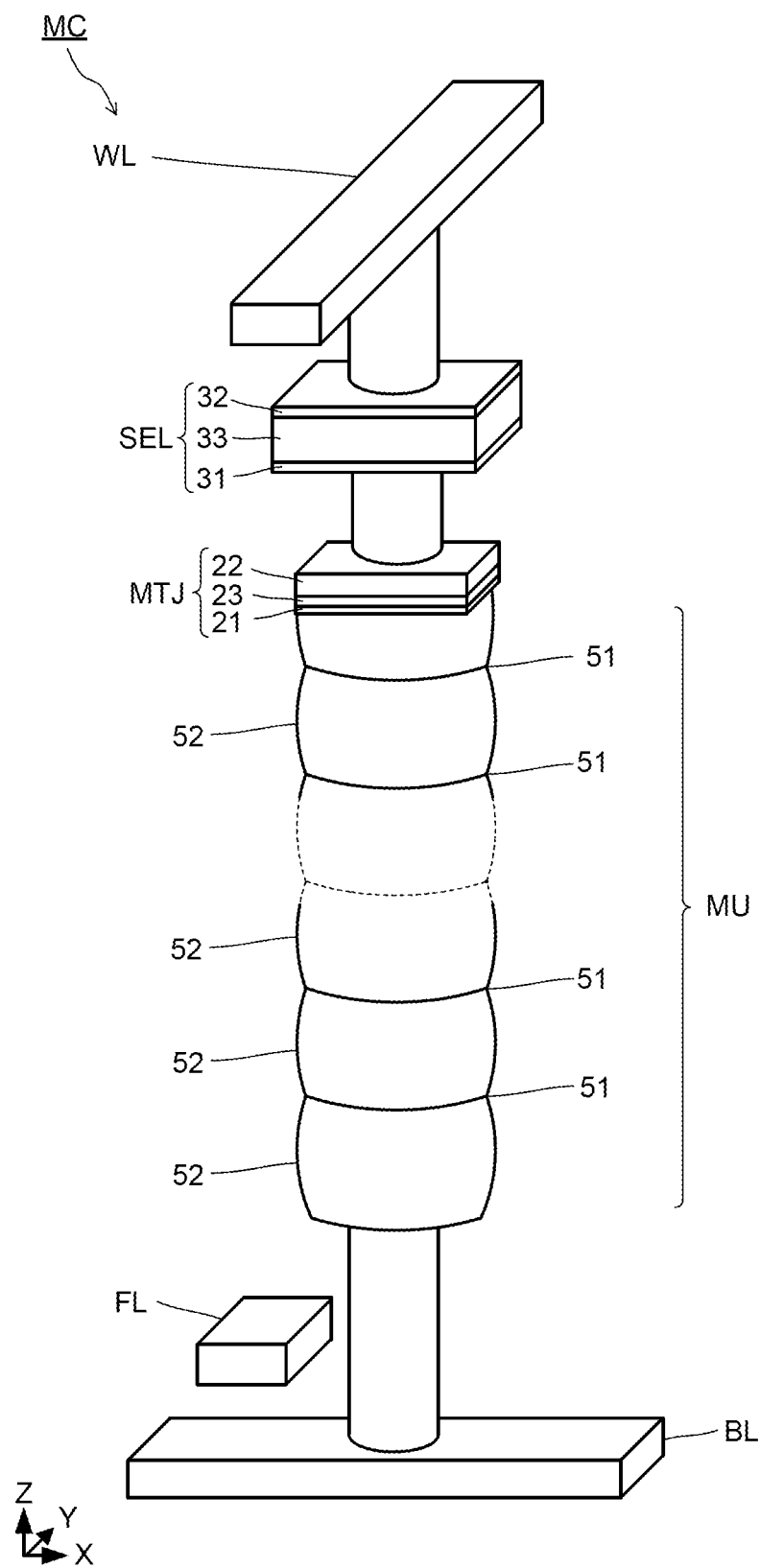
FIG. 4 is a schematic diagram illustrating a structural example of a memory cell.

FIG. 4 is a schematic diagram illustrating a structural example of the memory cell MC. The memory cell MC has a memory unit MU, a reproducing element MTJ, and a selection element SEL.

The memory unit MU extends along the Z-axis direction. The memory unit MU includes a pillar having a magnetic substance on its side surface.

The memory unit MU has perpendicular magnetic anisotropy or in-plane magnetic anisotropy. An easy magnetization axis direction of the memory cell MC is defined based on the magnetic anisotropy of the memory unit MU.

Materials of the magnetic substance include: a stacked film or an alloy of at least one first element (transition metal element) such as iron (Fe), cobalt (Co), nickel (Ni), manganese (Mn), and chromium (Cr) and at least one second element (noble metal element) such as platinum (Pt), palladium (Pd), iridium (Ir), ruthenium (Ru), and rhodium (Rh); an amorphous alloy of the first element (transition metal element) and a third element (semimetal element) such as boron (B), silicon (Si), germanium (Ge), and antimony (Sb); and an amorphous alloy of the first element and a fourth element (rare earth element) such as gadolinium (Gd), terbium (Tb), dysprosium (Dy), holmium (Ho), and erbium (Er), and so on. Nonmagnetic elements such as gold (Au), silver (Ag), copper (Cu), aluminum (Al), magnesium (Mg), bismuth (Bi), tantalum (Ta), and carbon (C) may be added to the above magnetic materials to adjust various properties such as magnetic properties, crystallinity, mechanical properties, and chemical properties.

The reproducing element MTJ is provided between the memory unit MU and the selection element SEL. The reproducing element MTJ is electrically connected to the memory unit MU and the selection element SEL. The reproducing element MTJ is connected to the memory unit MU, for example, through a magnetic layer. The reproducing element MTJ functions as a read element for reading data in the memory unit MU during the read operation of the storage device 1.

The reproducing element MTJ is a magnetoresistive effect element. The magnetoresistive effect element includes a magnetic layer 21, a magnetic layer 22, and a nonmagnetic layer 23. The nonmagnetic layer 23 is provided between the magnetic layer 21 and the magnetic layer 22 in the Z-axis direction. The magnetic layer 21, the magnetic layer 22, and the nonmagnetic layer 23 form a magnetic tunnel junction (MTJ). In the following, the magnetoresistive effect element including the magnetic tunnel junction is called a magnetic tunnel junction element (MTJ element). The nonmagnetic layer 23 of the MTJ element is called a tunnel barrier layer.

Examples of the magnetic layers 21 and 22 are ferromagnetic layers that contain at least one element of cobalt, iron, and boron. The magnetic layers 21 and 22 may be a single-layer film or a multilayer film (for example, artificial lattice film). The nonmagnetic layer 23 is, for example, an insulating film containing magnesium oxide. The nonmagnetic layer 23 may be a single-layer film or a multilayer film.

The magnetic layers 21 and 22 have the in-plane magnetic anisotropy or the perpendicular magnetic anisotropy. The easy magnetization axis direction of the magnetic layers 21 and 22 with the in-plane magnetic anisotropy is substantially parallel to layer surfaces (film surfaces) of the magnetic layers. In this case, each of the magnetic layers 21 and 22 has magnetization that is substantially parallel to the layer surfaces of the magnetic layers 21 and 22. A magnetization direction of the magnetic layers 21 and 22 with the in-plane magnetic anisotropy is perpendicular to an arrangement direction, that is, a stacking direction (Z-axis direction) of the magnetic layers 21 and 22.

The easy magnetization axis direction of the magnetic layers 21 and 22 with the perpendicular magnetic anisotropy is substantially perpendicular to the layer surfaces (film surfaces) of the magnetic layers. In this case, each of the magnetic layers 21 and 22 has magnetization that is substantially perpendicular to the layer surfaces of the magnetic layers 21 and 22. The magnetization direction of the magnetic layers 21 and 22 with the perpendicular magnetic anisotropy is parallel to the arrangement direction, that is, the stacking direction (Z-axis direction) of the magnetic layers 21 and 22.

The magnetization direction of the magnetic layer 21 is variable. The magnetization direction of the magnetic layer 22 is invariable (fixed state). In the following, the magnetic layer 21 with the variable magnetization direction is called a storage layer. The magnetic layer 22 with the invariable (fixed) magnetization direction is called a reference layer. The magnetic layer 21 may also be called a free layer, a magnetization free layer, or a magnetization variable layer. The magnetic layer 22 may also be called a pin layer, a pinned layer, a magnetization invariable layer, or a magnetization fixed layer.

In this embodiment, "the magnetization direction of the reference layer (magnetic layer) is invariable" or "the magnetization direction of the reference layer (magnetic layer) is in a fixed state" means that the magnetization direction of the reference layer does not change before and after supply of current, voltage, or magnetic energy (for example, magnetic field) that changes the magnetization direction of the storage layer when the current, the voltage, or the magnetic energy is supplied to the reproducing element MTJ.

The selection element SEL is provided between the reproducing element MTJ and the word line WL. The selection element SEL is electrically connected to the reproducing element MTJ and the word line WL. The selection element SEL may be directly connected to the reproducing element MTJ without any other components therebetween.

The selection element SEL is used to control the connection between the memory unit MU and the word line WL. When the selection element SEL is set to an ON state, the memory unit MU is electrically connected to the word line WL. When the selection element SEL is set to an OFF state, the memory unit MU is electrically separated from the word line WL. The ON/OFF of the selection element SEL is controlled by controlling a potential difference between the bit line BL and the word line WL. As a result, one or more magnetic substances to be operated among the plurality of memory units MU are selected.

The selection element SEL includes, for example, an electrode 31, an electrode 32, and a switching layer 33. The switching layer 33 is provided between the electrode 31 and electrode 32. The electrode 31 is provided on the reproducing element MTJ in the Z-axis direction. The switching layer 33 is provided on the electrode 31 in the Z-axis direction. The electrode 32 is provided on the switching layer 33 in the Z-axis direction. A material of the switching layer 33 is transition metal oxide, a chalcogenide compound, or the like.

A resistance state of the switching layer 33 changes to a high resistance state or a low resistance state according to the supplied current (or voltage). As a result, the selection element SEL is set to the ON state (low resistance state, continuity state) when the current greater than or equal to a threshold current (or voltage greater than or equal to a threshold voltage) of the selection element SEL is supplied to the memory unit MU. The selection element SEL is set to the OFF state (high resistance state, non-continuity state) when the current less than the threshold current of the selection element SEL is supplied to the memory unit MU.

The selection element SEL in the OFF state electrically separates the memory unit MU from the word line WL. The selection element SEL in the ON state is capable of passing current into the memory cell MC. The selection element SEL in the ON state supplies the memory unit MU with the current that flows from the bit line BL side toward the word line WL side or from the word line WL side toward the bit line BL side, according to the potential difference between the bit line BL and the word line WL. Thus, the selection element SEL is an element capable of passing current to the memory unit MU in both directions.

The memory cell MC is superimposed on a field line FL. The field line FL is provided above the bit line BL in the Z-axis direction. The field line FL extends in the Y-axis direction. The field line FL spans a plurality of memory cells MC.

The field line FL is wiring for writing data in a magnetic field writing method during the write operation of the storage device 1 (hereinafter, referred to as write wiring). During the write operation in the magnetic field writing method, write pulses (hereinafter, also called write current) are supplied to the field line FL. The write current generates a magnetic field around the field line FL. The generated magnetic field is applied to the memory unit MU. A magnetization direction of the memory unit MU is set according to a direction of the generated magnetic field. This can write data into the memory unit MU. The direction of the magnetic field changes according to the direction of the write current flowing in the field line FL. Therefore, the direction of the write current flow in the field line FL is set according to the data to be written.

The field line FL is electrically connected to the row driver 11 and the write circuit 13. A state of the field line FL is controlled, for example, by the row driver 11. The supply of the write current to the field line FL is controlled by the write circuit 13.

In the storage device 1, dimensions of the memory unit MU (for example, a diameter of the pillar) vary periodically along the Z-axis direction. The memory unit MU is constricted at predetermined intervals (periods) in the Z-axis direction. In this embodiment, a structure periodically changing (periodically constricting) in dimensions is called a constriction structure.

The constricted portions of the memory unit MU are referred to as depressions 51. A range (region) having a certain dimension in the Z-axis direction including the depression 51 is called a constricted region (or magnetic domain wall existing region). For example, the constricted region is a region with a certain range centered on the depression 51. The depression 51 is a region with a certain dimension. Therefore, the constricted region may be regarded as the depression 51.

A dimension (diameter of the pillar) D1 of the depression 51 in the X-axis and Y-axis directions is smaller than dimensions of portions other than the depression 51. The dimension D1 is the smallest dimension in the X-axis direction (or Y-axis direction) of the memory unit MU with the constriction structure.

The memory unit MU includes a plurality of protrusions 52. One protrusion 52 is provided between two depressions 51 aligned in the Z-axis direction. The protrusion 52 protrudes outward from the magnetic substance in the Z-axis direction more than the depression 51. The protrusion 52 substantially corresponds to a cell portion of the memory cell MC.

The protrusion 52 is provided in a region between the two depressions 51 in the memory unit MU. In the following, the region (range) between the two depressions 51 is referred to as a cell region (magnetization region or magnetic domain wall displacement region).

One protrusion 52 is provided between the two depressions 51 in the Z-axis direction. The depression 51 substantially corresponds to a boundary portion between memory cells MC adjacent to each other in the Z-axis direction.

The protrusion 52 has a dimension (diameter of the pillar) D2 in the X-axis or Y-axis direction. The dimension D2 of the protrusion 52 is larger than the dimension D1 of the depression 51. For example, the dimension D2 is the largest dimension in the X-axis direction (or Y-axis direction) of the memory unit MU with the constriction structure.

The dimension of the protrusion (cell region) 52 in the X-axis direction (or Y-axis direction) decreases gradually from a center portion of the protrusion 52 toward the depression 51 side. A volume of a magnetic substance (magnetic layer) of the depression 51 is smaller than a volume of a magnetic substance of the protrusion 52.

Each protrusion (cell region) 52 in one memory unit MU may have a magnetization (magnetic domain). The memory unit MU has the perpendicular magnetic anisotropy. A film surface (layer surface) of the memory unit MU is along the Z-axis direction. Hence, the easy magnetization axis direction of the memory unit MU with the perpendicular magnetic anisotropy intersects the Z-axis direction. When the memory unit MU has the perpendicular magnetic anisotropy, for example, magnetic layers having the perpendicular magnetic anisotropy are used for the magnetic layers 21 and 22 of the reproducing element MTJ. However, in this case, magnetic layers having the in-plane magnetic anisotropy may be used for the magnetic layers 21 and 22 of the reproducing element MTJ.

The memory unit MU may have the in-plane magnetic anisotropy. In this case, the easy magnetization axis direction of the memory unit MU is parallel to the Z-axis direction. When the memory unit MU has the in-plane magnetic anisotropy, for example, magnetic layers having the in-plane magnetic anisotropy are used for the magnetic layers 21 and 22 of the reproducing element MTJ. However, in this case, magnetic layers having the perpendicular magnetic anisotropy may be used for the magnetic layers 21 and 22 of the reproducing element MTJ.

Figure 5:
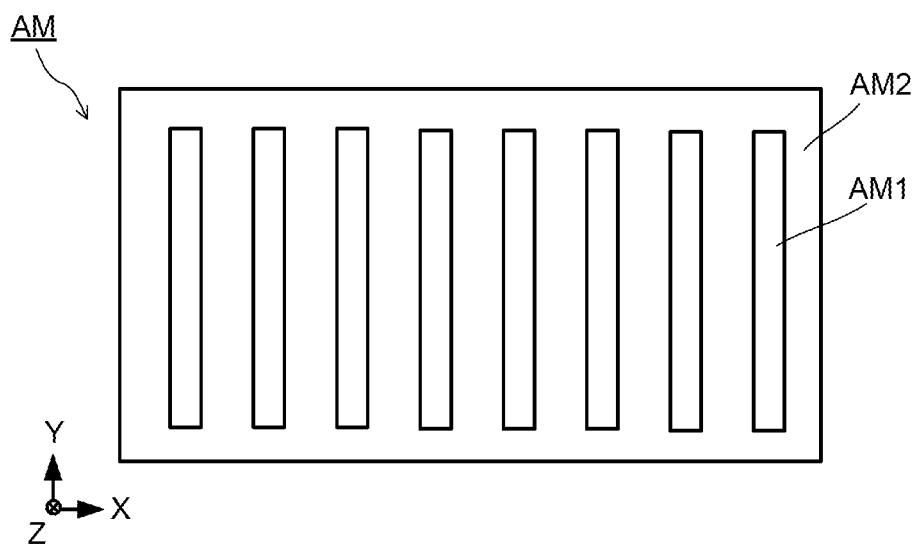
FIG. 5 is a schematic diagram illustrating a configuration example of an alignment mark region.

FIG. 5 is a schematic diagram illustrating a configuration example of the alignment mark region AM. The alignment mark region AM includes a first alignment mark region AM1 and a second alignment mark region AM2. The first alignment mark region AM1 is surrounded by the second alignment mark region AM2 along an X-Y plane. The configuration example of the alignment mark region AM illustrated in FIG. 5 is an example, and shapes, sizes, and arrangements of the first alignment mark region AM1 and second alignment mark region AM2 are not limited to this configuration example.

Figure 6:
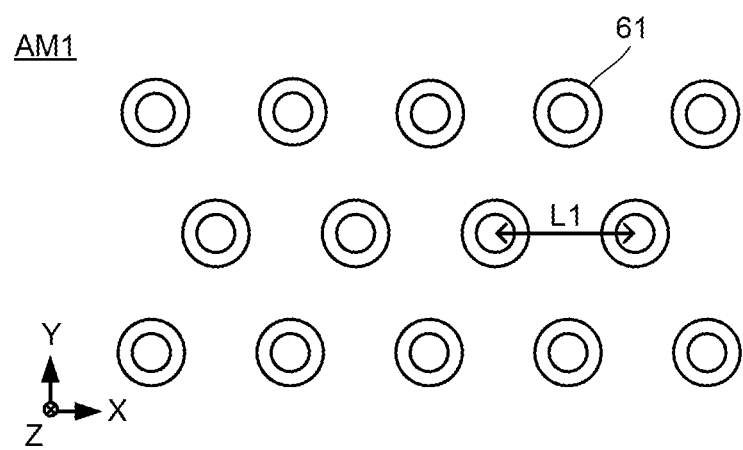
FIG. 6 is a schematic diagram illustrating a configuration example of a first alignment mark region.

FIG. 6 is a schematic diagram illustrating a configuration example of the first alignment mark region AM1. The first alignment mark region AM1 includes a plurality of pillars 61. The plurality of pillars 61 are arranged at regular intervals L1 along the X-Y plane. The plurality of pillars 61 extend along the Z-axis direction. The interval L1 is a distance between centers of adjacent pillars 61 in the X-Y plane. The plurality of pillars 61 have uniform dimensions.

Figure 7:
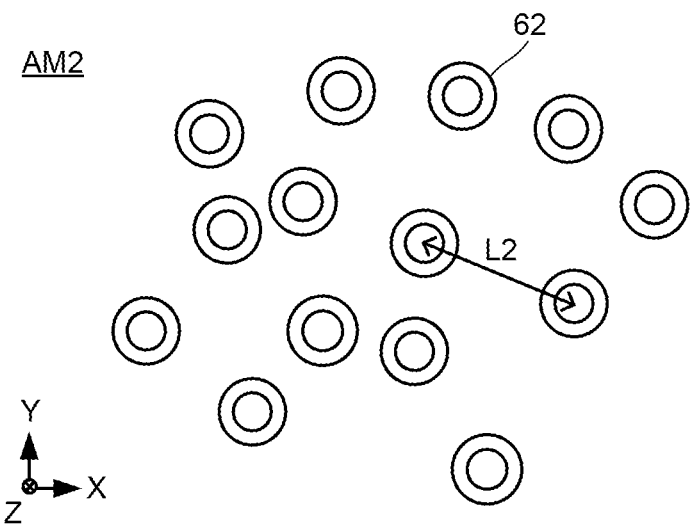
FIG. 7 is a schematic diagram illustrating a configuration example of a second alignment mark region.

FIG. 7 is a schematic diagram illustrating a configuration example of the second alignment mark region AM2. The second alignment mark region AM2 includes a plurality of pillars 62. The plurality of pillars 62 are arranged at irregular intervals L2 along the X-Y plane. The plurality of pillars 62 extend along the Z-axis direction. The interval L2 is a distance between centers of adjacent pillars 62 in the X-Y plane. FIG. 7 illustrates the plurality of pillars 62 having uniform dimensions. The plurality of pillars 62 are not limited thereto, and may not have uniform dimensions.

Figure 8:
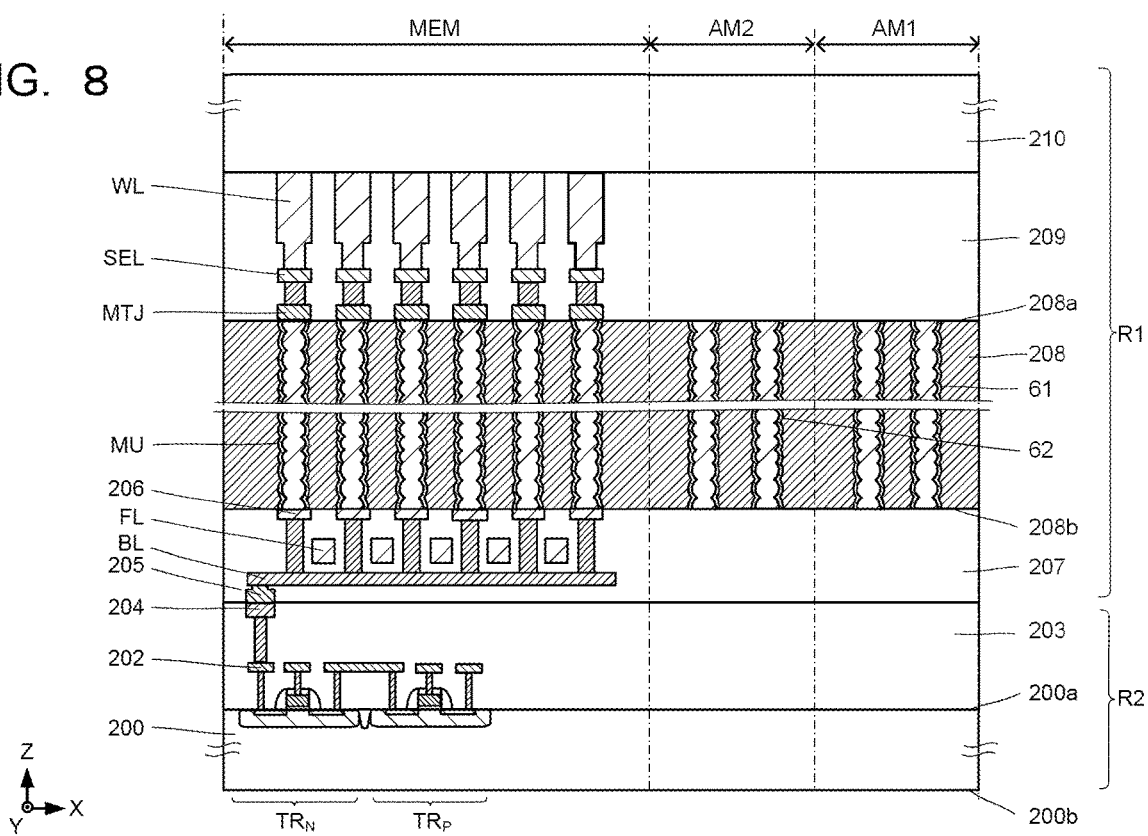
FIG. 8 is a cross-sectional schematic diagram illustrating a structural example of a storage device.

FIG. 8 is a cross-sectional schematic diagram illustrating a structural example of the storage device 1 and illustrates an X-Z cross-section. The storage device 1 illustrated in FIG. 8 has a first region R1 including the memory cell array 10, and a second region R2 including peripheral circuits such as the row driver 11, the column driver 12, the write circuit 13, the read circuit 14, the shift circuit 15, the voltage generation circuit 16, and the control circuit 17. The first region R1 and second region R2 are provided on separate substrates and are joined by bonding the substrates together. For convenience, the memory cell region MEM, the first alignment mark region AM1, and the second alignment mark region AM2 are illustrated next to each other in FIG. 8.

The storage device 1 illustrated in FIG. 8 includes a field-effect transistor $TR_N$ and field-effect transistor $TR_P$ provided on a semiconductor substrate 200, a conductive layer 202, an insulating layer 203, a connection pad 204, a connection pad 205, the bit lines BL, the field lines FL, a conductive layer 206, an insulating layer 207, an insulating layer 208, the memory units MU, the pillars 61, the pillars 62, the reproducing elements MTJ, the selection elements SEL, the word lines WL, an insulating layer 209, and a substrate 210.

Electronic elements such as the field-effect transistor $TR_N$ and field-effect transistor $TR_P$ are provided in any of the peripheral circuits such as the row driver 11, the column driver 12, the write circuit 13, the read circuit 14, the shift circuit 15, the voltage generation circuit 16, and the control circuit 17. For example, the electronic elements connected to the write circuit 13 may have a function as write elements.

The conductive layer 202 is connected to a source or drain of the field-effect transistor $TR_N$ or field-effect transistor $TR_P$ through a plurality of contact plugs, as illustrated in FIG. 8. The conductive layer 202 contains, for example, a metal material.

The insulating layer 203 is provided on the field-effect transistor $TR_N$ and field-effect transistor $TR_P$. The insulating layer 203 contains, for example, a silicon oxide layer.

The connection pad 204 is a connection pad on the semiconductor substrate 200 side. The connection pad 204 is connected to the conductive layer 202 through a contact plug. Another conductive layer may be provided between the conductive layer 202 and the connection pad 204, and the conductive layer 202 and the connection pad 204 may be electrically connected through the conductive layer. The connection pad 204 contains a metal material such as copper or a copper alloy, for example.

The connection pad 205 is a connection pad on the substrate 210 side. The connection pad 205 is connected to the bit line BL. The connection pad 205 contains a metal material such as copper or a copper alloy, for example.

The connection pads 204 and 205 are directly joined, for example, by element diffusion between metals, Van der Waals forces, recrystallization by cubical expansion or melting, and the like. Furthermore, the first region R1 and second region R2 provided on separate substrates can be bonded together by direct joining through element diffusion between insulators, the Van der Waals forces, chemical reactions such as dehydration condensation and polymerization, and the like.

The bit line BL is provided above the field-effect transistor $TR_N$ and field-effect transistor $TR_P$. The field line FL is provided above the bit line BL. The field line FL and the bit line BL contain, for example, a metal material.

The conductive layer 206 is connected to the bit line BL, for example, through a contact plug.

The insulating layer 207 contains, for example, silicon oxide ($SiO_2$) and silicon nitride (SiN).

The insulating layer 208 contains metal oxide. The metal oxide includes, for example, aluminum oxide (alumina). The insulating layer 208 has a surface 208a and surface 208b. The surface 208a and surface 208b intersect the Z-axis. The electronic elements such as the field-effect transistors $TR_N$ and $TR_P$ are provided on the surface 208b side.

The memory units MU are provided in a region between the surface 208a and surface 208b of the insulating layer 208 in the memory cell region MEM. The memory unit MU extends along the Z-axis direction. One end of the memory unit MU is electrically connected to the bit line BL through the conductive layer 206. The memory unit MU is electrically connected to the electronic element such as the field-effect transistor $TR_N$ or field-effect transistor $TR_P$ through the bit line BL.

The pillars 61 are provided in an insulating region between the surface 208a and surface 208b of the insulating layer 208 in the first alignment mark region AM1. The pillar 61 extends along the Z-axis direction.

The pillars 62 are provided in an insulating region between the surface 208a and surface 208b of the insulating layer 208 in the second alignment mark region AM2. The pillar 62 extends along the Z-axis direction.

The reproducing elements MTJ are provided on the surface 208a side of the insulating layer 208. The reproducing element MTJ is provided above the memory unit MU.

The selection elements SEL are provided on the surface 208a side of the insulating layer 208. The selection element SEL is provided above the reproducing element MTJ.

The word lines WL are provided above the selection elements SEL. The word line WL contains, for example, a metal material.

The insulating layer 209 is provided on the surface 208a side of the insulating layer 208. The insulating layer 209 electrically separates each of the plurality of reproducing elements MTJ, the plurality of selection elements SEL, and the plurality of word lines WL.

The substrate 210 is not limited to any particular type of substrate, but for example, a wiring substrate may be used. The substrate 210 has, for example, a plurality of electrode pads on its surface. The plurality of electrode pads are connected to the word lines WL. The substrate 210 is electrically connected to peripheral circuits formed on the semiconductor substrate 200 through contact plugs and connection pads not illustrated in the drawing.

Figure 9:
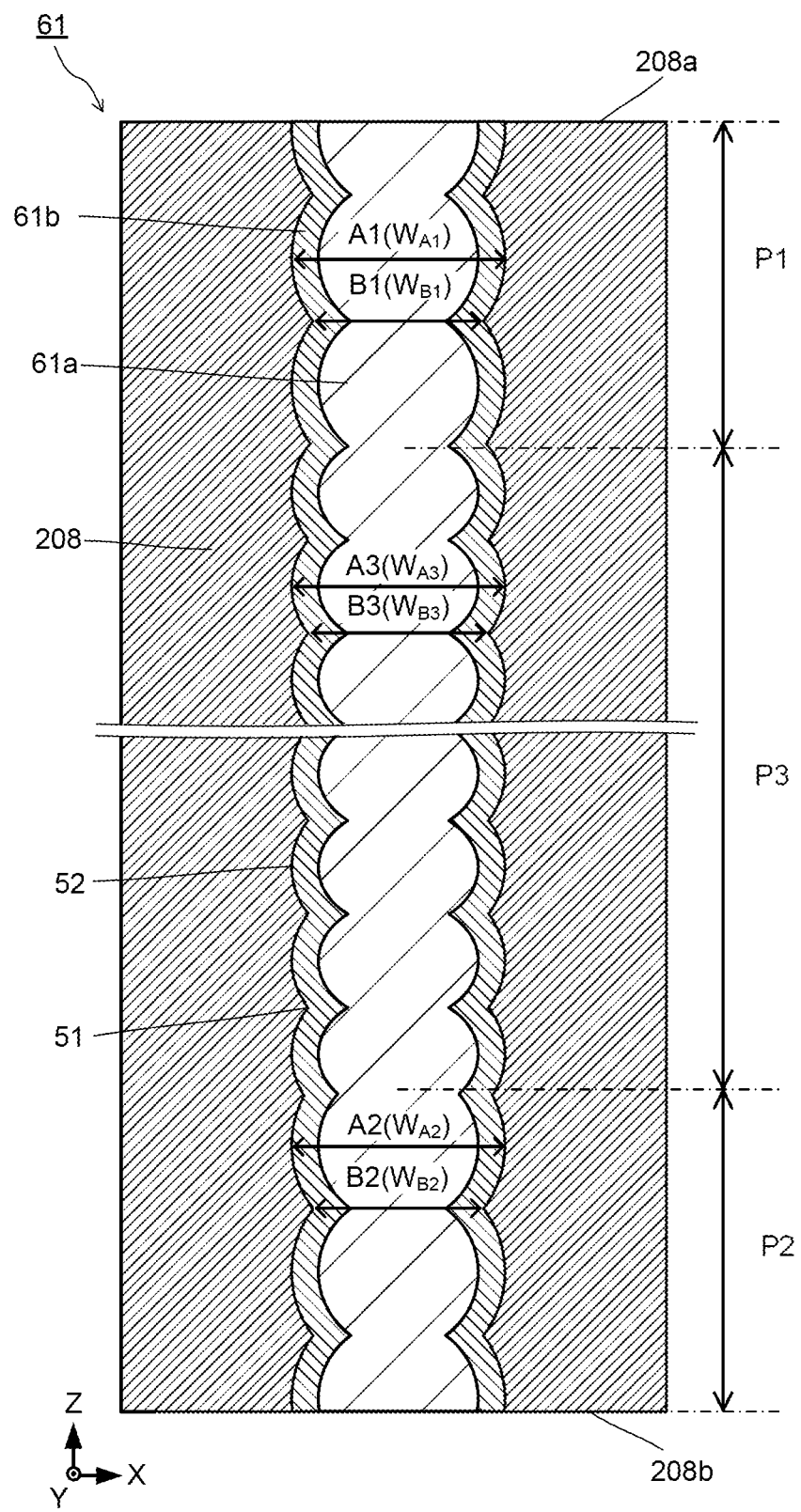
FIG. 9 is a cross-sectional schematic diagram illustrating a structural example of a pillar.

FIG. 9 is a cross-sectional schematic diagram illustrating a structural example of a pillar. Here, an example of the pillar 61 is described as the pillar, but the pillar 62 and the memory unit MU have a similar structure as the pillar 61.

The pillar 61 illustrated in FIG. 9 has an insulator 61a and a magnetic substance 61b. The insulator 61a is provided in the insulating layer 208. The insulator 61a extends along the Z-axis direction. The magnetic substance 61b is provided between the insulating layer 208 and the insulator 61a. The magnetic substance 61b is provided on a side surface of the pillar 61 and surrounds an outer periphery of the insulator 61a. The magnetic substance 61b extends along the Z-axis direction. A similar material as the magnetic substance of the memory unit MU can be used as a material of the magnetic substance 61b.

The pillar 61 further includes three regions: a region P1, region P2, and region P3. The regions P1, P2, and P3 each have the depressions 51 and the protrusions 52, similar to the memory unit MU illustrated in FIG. 4.

The region P1 has portions A1 with a maximum diameter $W_{A1}$ and portions B1 with a minimum diameter $W_{B1}$ along the Z-axis direction from the surface 208a side. The portions A1 and portions B1 are alternately provided along the Z-axis direction. Thus, the portion A1 is provided between two portions B1 adjacent to these portions B1 in the Z-axis direction, and the portion B1 is provided between two portions A1 adjacent to these portions A1 in the Z-axis direction. In the Z-axis direction, the portions A1 or portions B1 that are closest to each other have a first distance. For example, the first distance is 100 nm or more and 200 nm or less. The maximum diameter is an extreme value (a local or a global maximum value) of the diameter of the pillar 61. The minimum diameter is an extreme value (a local or global minimum value) of the diameter of the pillar 61. The maximum diameters $W_{A1}$ of the plurality of portions A1 can be the same or different values from each other. The minimum diameters $W_{B1}$ of the plurality of portions B1 may be the same or different values from each other.

FIG. 9 illustrates an example in which the diameter of the region P1 changes with a first period along the Z-axis direction from the surface 208a side, as an example. The first period is not particularly limited, but is, for example, 100 nm or more and 200 nm or less.

The region P2 has portions A2 with a maximum diameter $W_{A2}$ and portions B2 with a minimum diameter $W_{B2}$ along the Z-axis direction from the surface 208b side. The portions A2 and portions B2 are alternately provided along the Z-axis direction. Thus, the portion A2 is provided between two portions B2 adjacent to these portions B2 in the Z-axis direction, and the portion B2 is provided between two portions A2 adjacent to these portions A2 in the Z-axis direction. In the Z-axis direction, the portions A2 or portions B2 that are closest to each other have a second distance. For example, the second distance is 100 nm or more and 200 nm or less. The maximum diameters $W_{A2}$ of the plurality of portions A2 may be the same or different values from each other. The minimum diameters $W_{B2}$ of the plurality of portions B2 may be the same or different values from each other.

FIG. 9 illustrates an example in which the diameter of the region P2 changes with a second period along the Z-axis direction from the surface 208b side, as an example. The second period is not particularly limited but is, for example, 100 nm or more and 200 nm or less.

The region P3 is provided between the region P1 and region P2. The region P3 has portions A3 with a maximum diameter $W_{A3}$ and portions B3 with a minimum diameter $W_{B3}$ along the Z-axis direction. The portions A3 and portions B3 are alternately provided along the Z-axis direction. Thus, the portion A3 is provided between two portions B3 adjacent to these portions B3 in the Z-axis direction, and the portion B3 is provided between two portions A3 adjacent to these portions A3 in the Z-axis direction. In the Z-axis direction, the portions A3 or portions B3 that are closest to each other have a third distance. The third distance is shorter than each of the first and second distances. For example, the third distance is 80 nm or less. The maximum diameters $W_{A3}$ of the plurality of portions A3 may be the same or different values from each other. The minimum diameters $W_{B3}$ of the plurality of portions B3 may be the same or different values from each other.

FIG. 9 illustrates an example in which the diameter of the region P3 changes with a third period along the Z-axis direction, as an example. The third period is shorter than each of the first and second periods. The third period is, for example, 80 nm or less.

When a distance between centers of the plurality of pillars 61 is shorter than a wavelength of light, a layer in which the plurality of pillars 61 are formed can be regarded as a film with an effective refractive index. The effective refractive index is determined by a refractive index and density of each of the pillar 61 and the insulating layer 208. Furthermore, when the diameter of the pillar 61 is periodically changed (also called modulation), the effective refractive index can be periodically changed in the Z-axis direction. Therefore, interference of light in the Z-axis direction increases reflectance of light in a specific wavelength range according to the modulation period of the diameter.

The first alignment mark region AM1, which includes the plurality of pillars 61 arranged at regular intervals L1, and the second alignment mark region AM2, which includes the plurality of pillars 62 arranged at irregular intervals L2, have different pillar densities, resulting in a difference in the effective refractive index. As a result, a contrast ratio between the first alignment mark region AM1 and the second alignment mark region AM2 increases and can be used as alignment marks.

However, when the difference in the pillar densities between the two is small, the contrast ratio becomes small. Therefore, by adjusting the modulation period of the diameter to a period that matches a wavelength region of alignment detection light, a peak wavelength and peak intensity of the reflectance can be made different between the first alignment mark region AM1 and the second alignment mark region AM2. This makes it possible to increase the contrast ratio, thereby improving accuracy of alignment.

For example, the modulation period of the diameter can be more than 100 nm and 200 nm or less. On the other hand, from a viewpoint of high integration (high recording density), the modulation period of the diameter is preferably small. For example, it is 80 nm or less. Therefore, when the modulation period of the diameter of the pillar 61 is constant along the Z-axis direction, it will be difficult to achieve both high integration and improved alignment accuracy in the storage device.

In contrast, by varying the distances between the maximum diameters or the distances between the minimum diameters of the pillar among the region P1, region P2, and region P3, it is possible to achieve both high integration and improved alignment accuracy in the storage device.

Next, an example of a method for manufacturing the storage device 1 is explained with reference to FIG. 10 to FIG. 17. FIG. 10 to FIG. 17 are cross-sectional schematic diagrams for explaining the example of the method for manufacturing the storage device, and each illustrate an X-Z cross-section.

Figure 10:
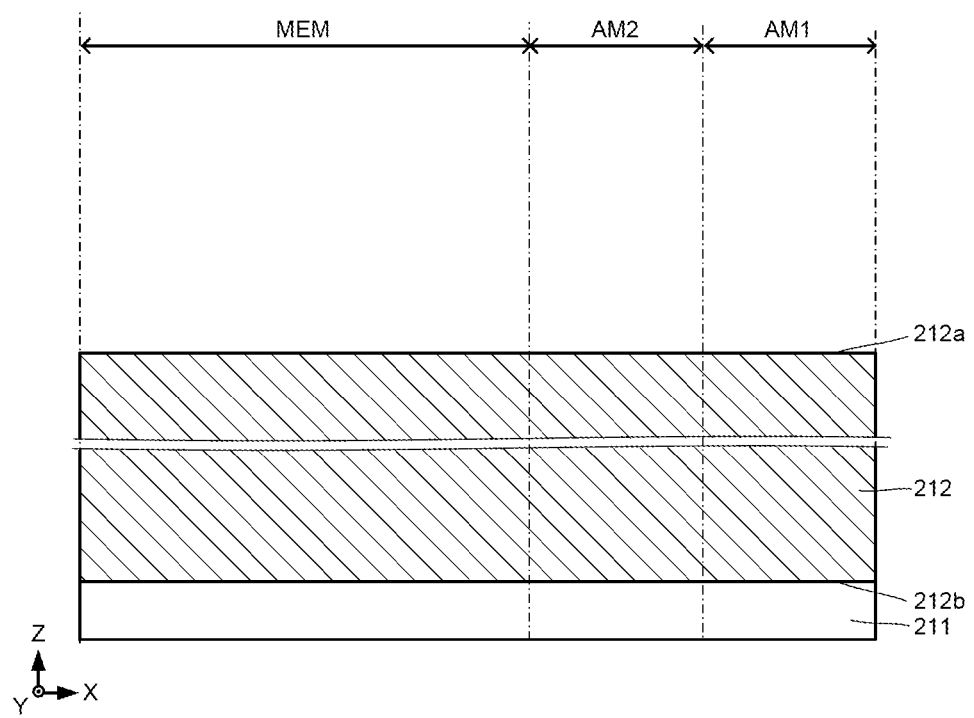
FIG. 10 is a cross-sectional schematic diagram to explain a manufacturing method example of a storage device.

First, as illustrated in FIG. 10, a metal layer 212 is formed on a substrate 211 such as a silicon substrate. The metal layer 212 includes a surface 212a and surface 212b. A thickness of the metal layer 212 ranges approximately from several μm to several hundred μm. For example, it is preferable to use high-purity aluminum with a purity of 99.90% or higher as the metal layer 212. The metal layer 212 can be formed, for example, by using sputtering, a plating method, a chemical vapor deposition method (CVD), or bonding a metal layer (metal substrate, metal foil) to the substrate 211, and the like.

In FIG. 10, the metal layer 212 is in direct contact with the substrate 211, but a film of other materials (for example, an insulating layer) may be formed between the metal layer 212 and the substrate 211. In this case, the metal layer 212 is formed on the insulating layer covering the substrate 211.

Figure 11:
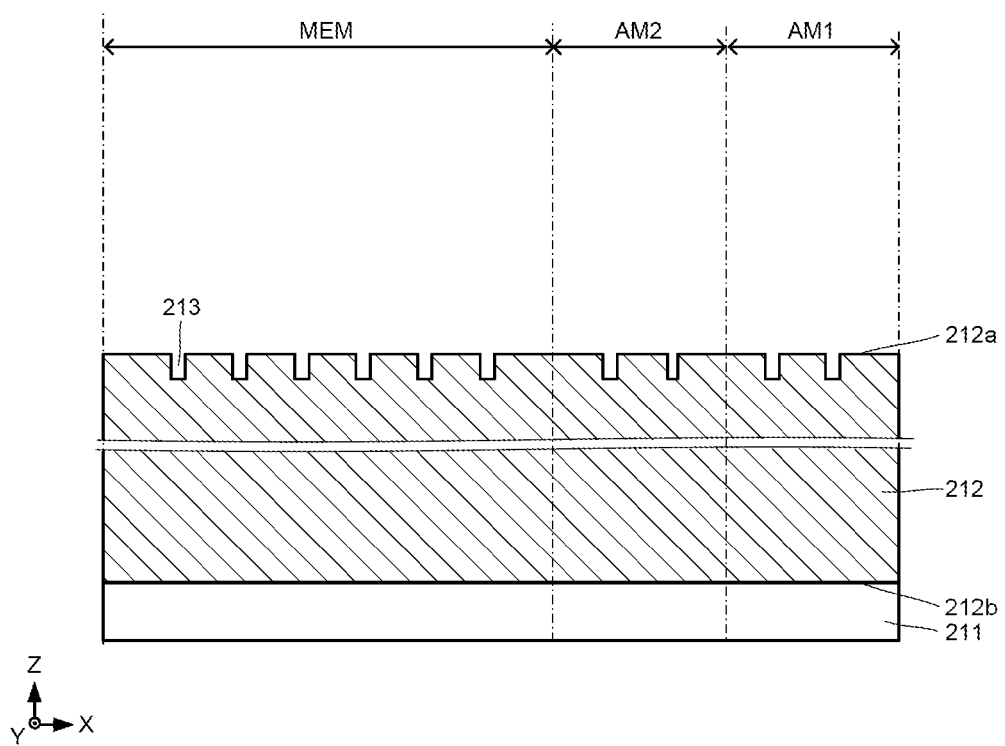
FIG. 11 is a cross-sectional schematic diagram to explain the manufacturing method example of the storage device.

Next, as illustrated in FIG. 11, a pattern including depressions 213 is formed on the metal layer 212. The depressions 213 serve as reaction starting points for anodization process. The pattern can be formed by, for example, forming a resist mask having a pattern on a surface of the metal layer 212 using photolithography technology and partially etching the metal layer 212 using the resist mask. The etching can be dry etching or wet etching. In the first alignment mark region AM1, the depressions 213 are arranged at regular intervals. Also, in the first alignment mark region AM1, dimensions of the depressions 213 are made uniform. In the second alignment mark region AM2, the depressions 213 are arranged at irregular intervals.

Figure 12:
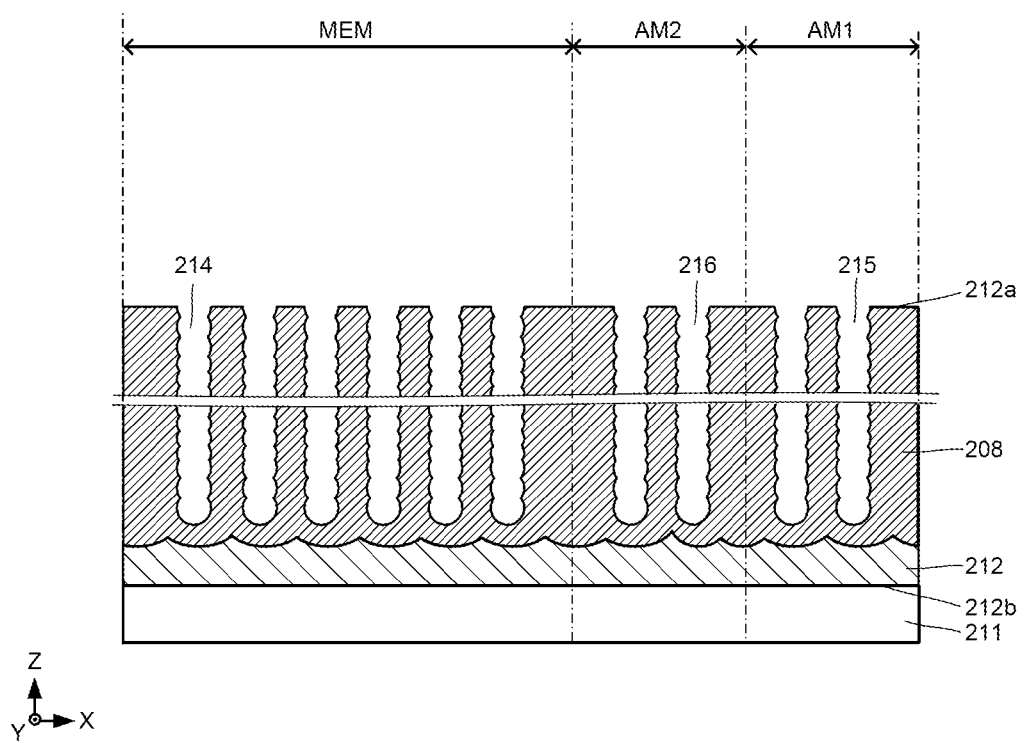
FIG. 12 is a cross-sectional schematic diagram to explain the manufacturing method example of the storage device.

Next, as illustrated in FIG. 12, the metal layer 212 is anodized to form the insulating layer 208 having depressions 214 in the memory cell region MEM, depressions 215 in the first alignment mark region AM1, and depressions 216 in the second alignment mark region AM2. The depressions 214 to 216 are also referred to as alumina holes. The metal layer 212 may partially remain below the depressions 214 to 216.

It is also possible to form the depressions 216 at irregular intervals by anodizing the metal layer 212 without forming the depressions 213.

The metal layer 212 is anodized, for example, by immersing it in an electrolytic solution in an anodization apparatus and applying a voltage to the substrate 211. A depth of each alumina hole can be controlled by adjusting the time of the anodization.

Figure 13:
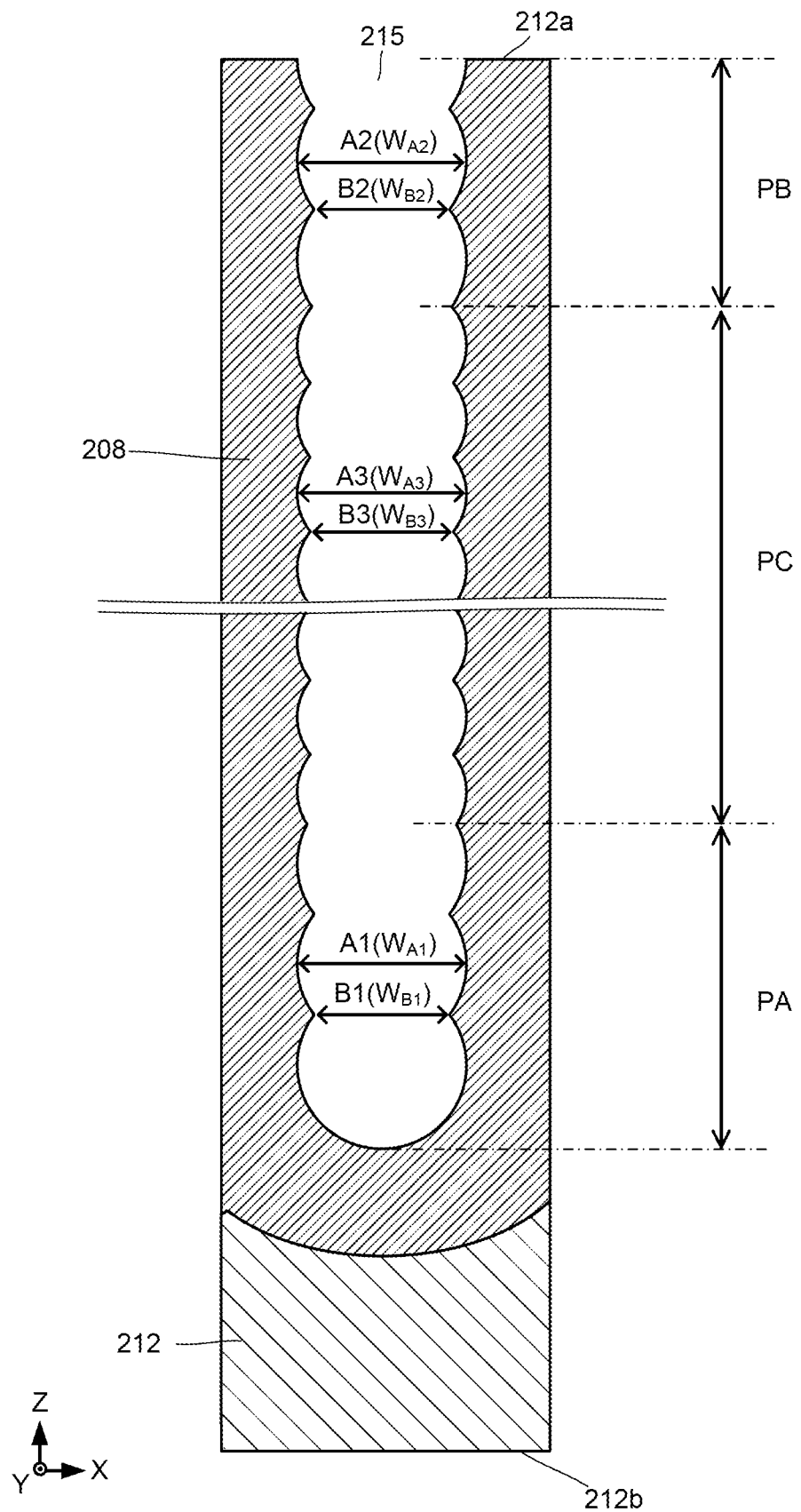
FIG. 13 is a cross-sectional schematic diagram to explain the manufacturing method example of the storage device.

FIG. 13 is a cross-sectional schematic diagram illustrating a structural example of the alumina hole. Here, an example of the depression 216 is described as the alumina hole, but the depressions 214 and 215 may have a similar structure. The depression 216 illustrated in FIG. 13 includes three regions: a region PA, region PB, and region PC.

The region PA is a region where the region P1 in FIG. 9 is formed. The region PA has the portions A1 having the maximum diameter $W_{A1}$ and the portions B1 having the minimum diameter $W_{B1}$ along the Z-axis direction. The region PA can be formed, for example, by anodizing the metal layer 212 by applying a first alternating voltage after formation of the region PC.

The region PB is a region where the region P2 in FIG. 9 is formed. The region PB has the portions A2 having the maximum diameter $W_{A2}$ and the portions B2 having the minimum diameter $W_{B2}$ along the Z-axis direction. The region PB can be formed, for example, by anodizing the metal layer 212 by applying a third alternating voltage.

The region PC is a region where the region P3 in FIG. 9 is formed. The region PC has the portions A3 having the maximum diameter $W_{A3}$ and the portions B3 having the minimum diameter $W_{B3}$ along the Z-axis direction. The third distance is shorter than each of the first and second distances. The region PC can be formed by anodizing the metal layer 212 by applying a second alternating voltage after the formation of the region PB. The second alternating voltage has a higher frequency than each of the first alternating voltage and third alternating voltage. In other words, each of the first alternating voltage and third alternating voltage has a lower frequency than the second alternating voltage.

Figure 14:
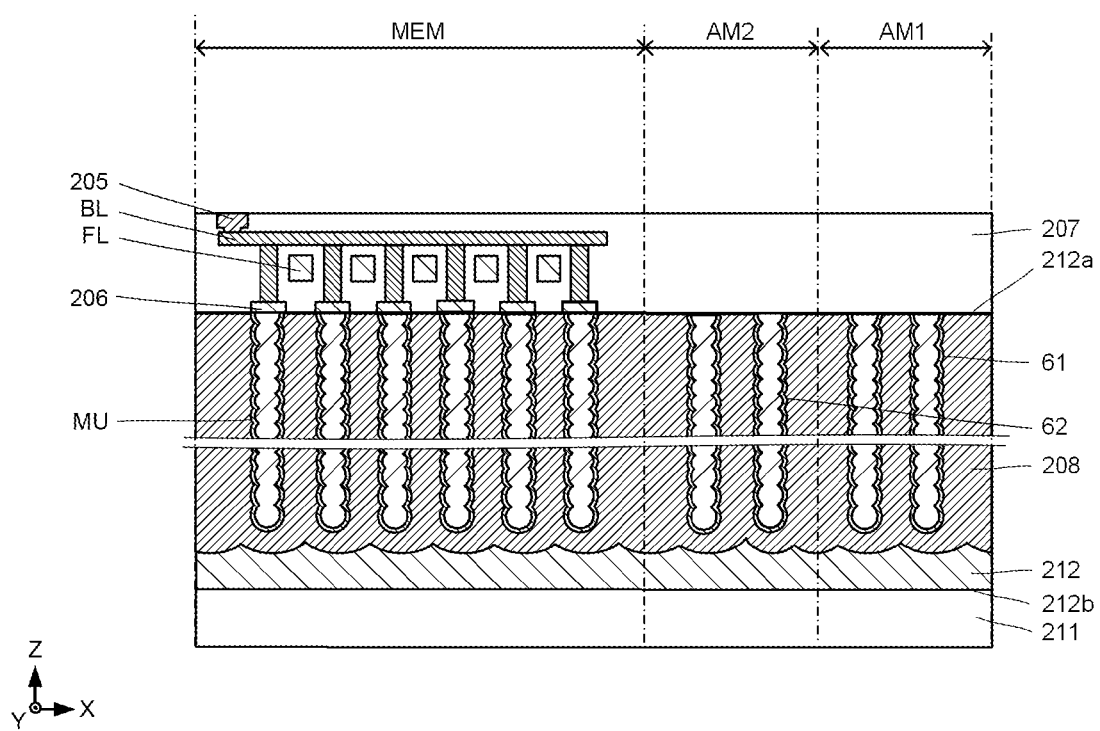
FIG. 14 is a cross-sectional schematic diagram to explain the manufacturing method example of the storage device.

Next, as illustrated in FIG. 14, the memory unit MU is formed in each depression 214, the pillar 61 is formed in each depression 215, and the pillar 62 is formed in each depression 216. The memory units MU, the pillars 61, and the pillars 62 are formed by forming the magnetic substance in each of the depressions 214, 215, and 216 using, for example, the CVD method or an atomic layer deposition method (ALD), and then forming an insulator such as silicon oxide on the magnetic substance by the CVD, the ALD, or a coating method to fill the depressions 214, 21 5 and 216. In this way, the memory units MU, the pillars 61, and the pillars 62 can be formed by the same process. An air gap may be formed instead of the insulator.

The memory units MU, the pillars 61, and the pillars 62 are formed along surface shapes in the regions PA to PC of the alumina hole illustrated in FIG. 13. Therefore, it is possible to form a structure with the regions P1 to P3 described with reference to FIG. 9 for the memory units MU, the pillars 61, and the pillars 62.

Furthermore, as illustrated in FIG. 14, the conductive layer 206, the field lines FL, the bit lines BL, the connection pad 205, and the insulating layer 207 are formed on the surface 212a side. For processing these components, a resist mask formed by photolithography is used, and at least one of alignments between the resist mask and the substrate 211 is performed using alignment marks including the pillars 61 and 62.

Figure 15:
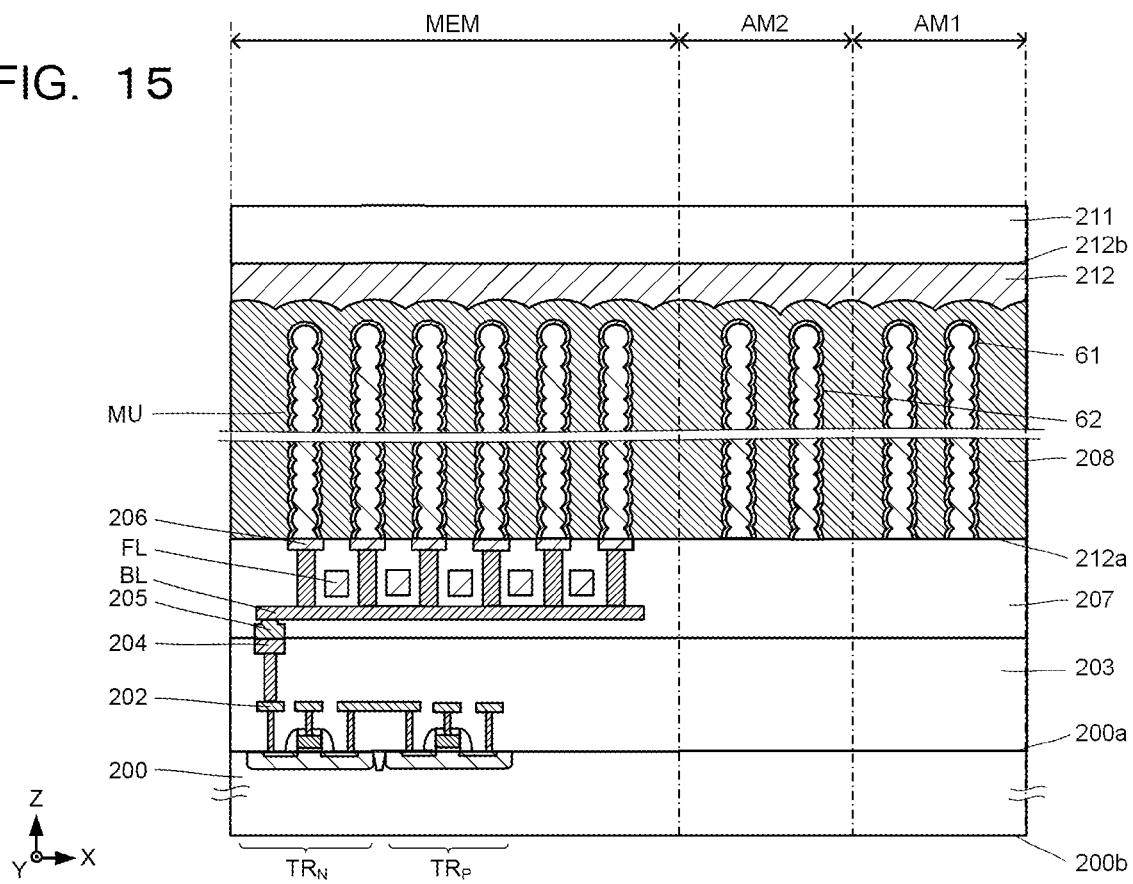
FIG. 15 is a cross-sectional schematic diagram to explain the manufacturing method example of the storage device.

Next, as illustrated in FIG. 15, the semiconductor substrate 200 on which the field-effect transistor $TR_N$, field-effect transistor $TR_P$, conductive layer 202, insulating layer 203, and connection pad 204 are formed, and the substrate 211, are bonded together to connect the connection pad 204 to connection pad 205.

Figure 16:
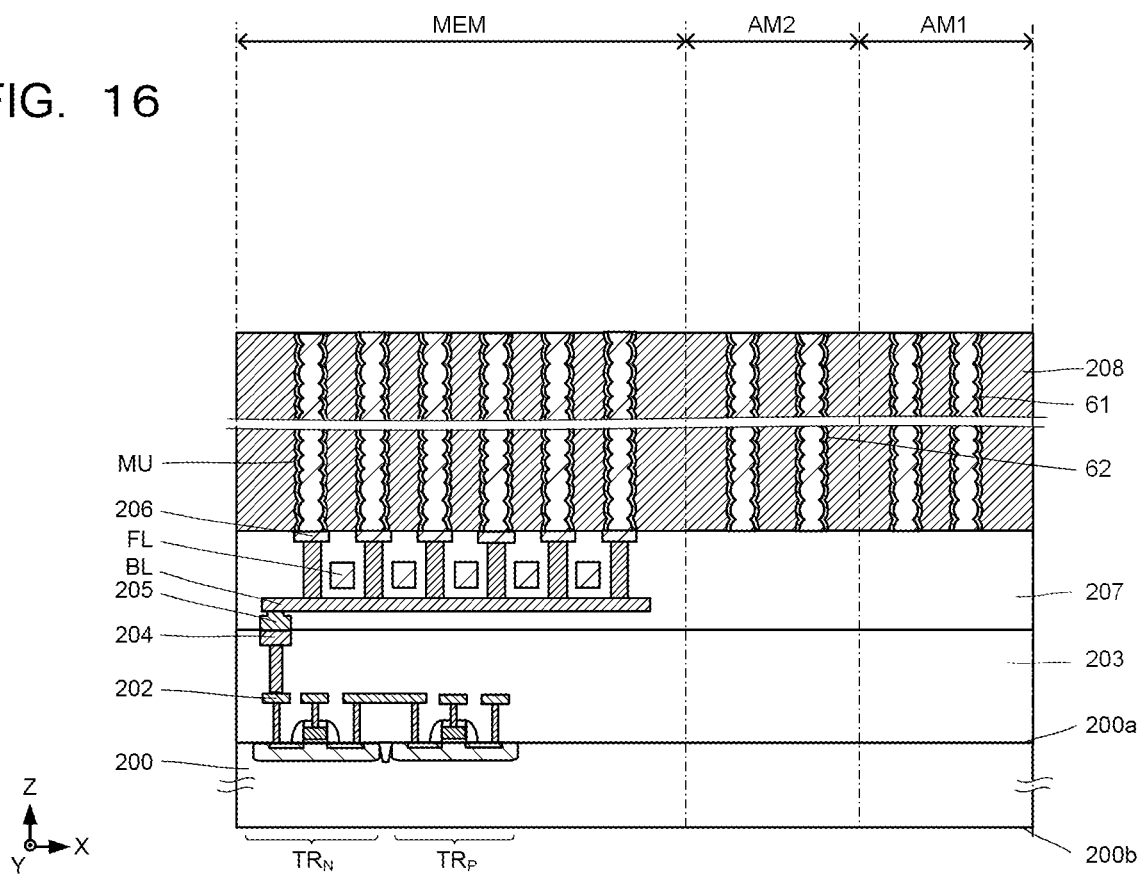
FIG. 16 is a cross-sectional schematic diagram to explain the manufacturing method example of the storage device.

Next, as illustrated in FIG. 16, the substrate 211, the unreacted metal layer 212, part of the insulating layer 208, part of the memory units MU, part of the pillars 61, and part of the pillars 62 are removed sequentially.

The unreacted metal layer 212 is removed, for example, by wet etching. This exposes a region above the alumina holes in the insulating layer 208.

Part of the insulating layer 208 can be removed by wet etching using phosphoric acid, for example.

Part of the memory units MU, part of the pillars 61, and part of the pillars 62 can be removed using chemical mechanical polishing (CMP), for example.

Figure 17:
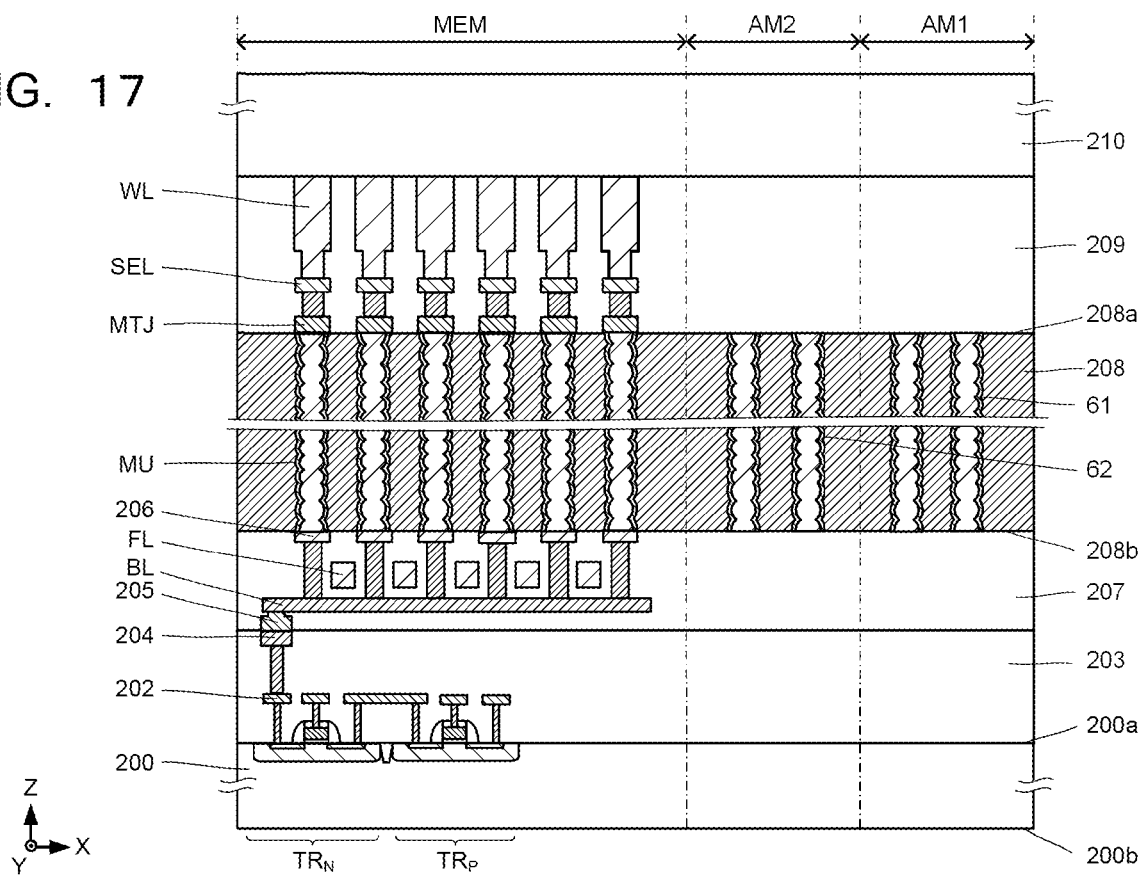
FIG. 17 is a cross-sectional schematic diagram to explain the manufacturing method example of the storage device.

Next, as illustrated in FIG. 17, the reproducing elements MTJ, the selection elements SEL, the word lines WL, the insulating layer 209, and the substrate 210 are formed. For processing these components, a resist mask formed by photolithography is used, and at least one of alignments between the resist mask and the semiconductor substrate 200 is carried out using alignment marks including the pillars 61 and 62. The above is the explanation of the example of the method for manufacturing the storage device 1.

As described above, the storage device of the embodiment has the alignment marks having the pillars. The pillar has the third region between the first and second regions. The third region changes in diameter with a shorter period than the first and second regions, for example. The above configuration improves contrast of alignment mark images generated during alignment. Therefore, it is possible to achieve both high integration and improved alignment accuracy in the storage device.

Furthermore, the above configuration allows the peak wavelength and the peak intensity of the reflectance to be different between the first alignment mark region AM1 and the second alignment mark region AM2. Therefore, in the above alignment mark image, the contrast ratio between the first alignment mark region AM1 and the second alignment mark region AM2 can be increased, so the alignment accuracy can be improved. Therefore, it is possible to achieve both high integration and improved alignment accuracy in the storage device.

While certain embodiments have been described, these embodiments have been presented by way of example only, and are not intended to limit the scope of the inventions. Indeed, those novel embodiments may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
    an insulating layer including a first surface, a second surface, a first insulating region provided between the first and second surfaces, and a second insulating region provided between the first and second surfaces;
    at least one memory unit provided in the first insulating region;

at least one first pillar provided in the second insulating region and extending in a first direction intersecting the first and second surfaces;

a first element provided adjacent to the first surface of the insulating layer; and a second element provided adjacent to the second surface of the insulating layer, wherein the at least one first pillar includes:
- a first region including a first portion, a second portion and a third portion, the first portion having a first maximum diameter, the second portion having a second maximum diameter, the third portion being provided between the first and second portions in the first direction, the third portion being provided on each of the first and second portions in the first direction, the third portion having a first minimum diameter, the first region continuously decreasing in diameter from the first portion to the third portion, the first region continuously decreasing in diameter from the second portion to the third portion, and the first and second portions defining a first distance therebetween in the first direction;
- a second region including a fourth portion, a fifth portion and a sixth portion, the fourth portion having a third maximum diameter, the fifth portion having a fourth maximum diameter, the sixth portion being provided between the fourth and fifth portions in the first direction, the sixth portion being provided on to each of the fourth and fifth portions in the first direction, the sixth portion having a second minimum diameter, the second region continuously decreasing in diameter from the fourth portion to the sixth portion, the second region continuously decreasing in diameter from the fifth portion to the sixth portion, and the fourth and fifth portions defining a second distance therebetween in the first direction; and
- a third region provided between the first and second regions in the first direction and including a seventh portion, an eighth portion and a ninth portion, the seventh portion having a fifth maximum diameter, the eighth portion having a sixth maximum diameter, the ninth portion being provided between the seventh and eighth portions in the first direction, the ninth portion being provided on each of the seventh and eighth portions in the first direction, the ninth portion having a third minimum diameter, the third region continuously decreasing in diameter from the seventh portion to the ninth portion, the third region continuously decreasing in diameter from the eighth portion to the ninth portion, the seventh and eighth portions defining a third distance therebetween in the first direction, and the third distance being shorter than each of the first and second distances.

2. The storage device according to claim 1, wherein
the first region further includes a tenth portion having a fourth minimum diameter,
the second region further includes an eleventh portion having a fifth minimum diameter, and
the third region further includes a twelfth portion having a sixth minimum diameter, wherein
the second portion is provided between the third and tenth portions in the first direction and the second portion is provided on each of the third and tenth portions in the first direction,
the fifth portion is provided between the sixth and eleventh portions in the first direction and the fifth portion is provided on each of the sixth and eleventh portions in the first direction, and
the eighth portion is provided between the ninth and twelfth portions in the first direction and the eighth portion is provided on each of the ninth and twelfth portions in the first direction, wherein
the first region continuously decreasing in diameter from the second portion to the tenth portion,
the second region continuously decreasing in diameter from the fifth portion to the eleventh portion,
the third region continuously decreasing in diameter from the eighth portion to the twelfth portion, and wherein
the third and tenth portions defines a fourth distance therebetween in the first direction,
the sixth and eleventh portions defines a fifth distance therebetween in the first direction,
the ninth and twelfth portions defines a sixth distance therebetween in the first direction, and
the sixth distance is shorter than each of the fourth and fifth distances.

3. The storage device according to claim 1, further comprising:
an alignment mark including at least part of the first pillar.

4. The storage device according to claim 1, wherein the memory unit includes a second pillar extending in the first direction, the second pillar includes:
- a fourth region including a thirteenth portion, a fourteenth portion and a fifteenth portion, the thirteenth portion having a seventh maximum diameter, the fourteenth portion having an eighth maximum diameter, the fifteenth portion being provided between the thirteenth and fourteenth portions in the first direction, to the fifteenth portion being provided on each of the thirteenth and fourteenth portions in the first direction, the fifteenth portion having a seventh minimum diameter, the fourth region continuously decreasing in diameter from the thirteenth portion to the fifteenth portion, the fourth region continuously decreasing in diameter from the fourteenth portion to the fifteenth portion, and the thirteenth and fourteenth portions defining a seventh distance therebetween in the first direction;
- a fifth region including a sixteenth portion, a seventeenth portion and an eighteenth portion, the sixteenth portion having a ninth maximum diameter, the seventeenth portion having a tenth maximum diameter, the eighteenth portion being provided between the sixteenth and seventeenth portions in the first direction, the eighteenth portion being provided on each of the sixteenth and seventeenth portions in the first direction, the eighteenth portion having an eighth minimum diameter, the fifth region continuously decreasing in diameter from the sixteenth portion to the eighteenth portion, the fifth region continuously decreasing in diameter from the seventeenth portion to the eighteenth portion, and the sixteenth and seventeenth portions defining an eighth distance therebetween in the first direction; and
- a sixth region provided between the fourth and fifth regions in the first direction and including a nineteenth portion, a twentieth portion and a twenty-first portion, the nineteenth portion having an eleventh maximum diameter, the twentieth portion having a twelfth maximum diameter, the twenty-first portion being provided between the nineteenth and twentieth portions in the first direction, the twenty-first portion being provided on each of the nineteenth and twentieth portions in the first direction, the twenty-first portion having a ninth minimum diameter, the sixth region continuously decreasing in diameter from the nineteenth portion to the twenty-first portion, the sixth region continuously decreasing in diameter from the twentieth portion to the twenty-first portion, the nineteenth and twentieth portions defining a ninth distance therebetween in the first direction, and the ninth distance being shorter than each of the seventh and eighth distances.

5. The storage device according to claim 1, wherein the at least one first pillar includes:
a first plurality of pillars arranged at regular intervals along the first surface or the second surface, and
a second plurality of pillars arranged at irregular intervals along the first surface or the second surface.

6. The storage device according to claim 1, wherein the insulating layer contains aluminum oxide.

7. The storage device according to claim 1, wherein the first element is a read element, and
the second element is a write element.

8. The storage device according to claim 1, wherein the first element is a magnetoresistive effect element, and
the second element is wiring that generates a magnetic field when current flows therethrough.

9. A method for manufacturing a storage device, comprising:
anodizing a metal layer to form an insulating layer, the insulating layer including a first surface, a second surface, at least one first depression, and at least one second depression, the at least one first depression extending in a first direction intersecting the first and second surfaces, and the second depression extending in the first direction;
forming a memory unit in the at least one first depression, and forming a first pillar in the at least one second depression, at least part of the first pillar being an alignment mark;
forming a first element adjacent to the first surface of the insulating layer, and
forming a second element adjacent to the second surface of the insulating layer,
wherein the at least one second depression has:
a first region including a first portion, a second portion and a third portion, the first portion having a first maximum diameter, the second portion having a second maximum diameter, the third portion being provided between the first and second portions in the first direction, the third portion being provided on each of the first and second portions in the first direction, the third portion having a first minimum diameter, the first region continuously decreasing in diameter from the first portion to the third portion, the first region continuously decreasing in diameter from the second portion to the third portion, and the first and second portions defining a first distance therebetween in the first direction;
a second region including a fourth portion, a fifth portion and a sixth portion, the fourth portion having a third maximum diameter, the fifth portion having a fourth maximum diameter, the sixth portion being provided between the fourth and fifth portions in the first direction, the sixth portion being provided on each of the fourth and fifth portions in the first direction, the sixth portion having a second minimum diameter, the second region continuously decreasing in diameter from the fourth portion to the sixth portion, the second region continuously decreasing in diameter from the fifth portion to the sixth portion, and the fourth and fifth portions defining a second distance therebetween in the first direction; and
a third region provided between the first and second regions in the first direction, including a seventh portion, an eighth portion and a ninth portion, the seventh portion having a fifth maximum diameter, the eighth portion having a sixth maximum diameter, the ninth portion being provided between the seventh and eighth portions in the first direction, the ninth portion being provided on each of the seventh and eighth portions in the first direction, the sixth portion having a third minimum diameter, the third region continuously decreasing in diameter from the seventh portion to the ninth portion, the third region continuously decreasing in diameter from the eighth portion to the ninth portion, the seventh and eighth portions defining a third distance therebetween in the first direction, and the third distance being shorter than each of the first and second distances.

10. The method according to claim 9, wherein
the first region is formed by applying a first alternating voltage to anodize the metal layer,
the third region is formed by applying a second alternating voltage after forming the first region to anodize the metal layer, the second alternating voltage being higher than the first alternating voltage in their frequencies, and
the second region is formed by applying a third alternating voltage after forming the third region to anodize the metal layer, the third alternating voltage being lower than the second alternating voltage in their frequencies.

11. The method according to claim 9, wherein
the first region further includes a tenth portion having a fourth minimum diameter,
the second region further includes an eleventh portion having a fifth minimum diameter, and
the third region further includes a twelfth portion having a sixth minimum diameter, wherein
the second portion is provided between the third and tenth portions in the first direction and the second portion is provided on each of the third and tenth portions in the first direction,
the fifth portion is provided between the sixth and eleventh portions in the first direction and the fifth portion is provided on each of the sixth and eleventh portions in the first direction, and
the eighth portion is provided between the ninth and twelfth portions in the first direction and the eighth portion is provided on each of the ninth and twelfth portions in the first direction, wherein
the first region continuously decreasing in diameter from the second portion to the tenth portion,
the second region continuously decreasing in diameter from the fifth portion to the eleventh portion,
the third region continuously decreasing in diameter from the eighth portion to the twelfth portion, and wherein
the third and tenth portions defines a fourth distance therebetween in the first direction,
the sixth and eleventh portions defines a fifth distance therebetween in the first direction,
the ninth and twelfth portions defines a sixth distance therebetween in the first direction, and
the sixth distance is shorter than each of the fourth and fifth distances.

12. The method according to claim 9, wherein the at least one first depression includes:
- a fourth region including a thirteenth portion, a fourteenth portion and a fifteenth portion, the thirteenth portion having a seventh maximum diameter, the fourteenth portion having an eighth maximum diameter, the fifteenth portion being provided between the thirteenth and fourteenth portions in the first direction, the fifteenth portion being provided on each of the thirteenth and fourteenth portions in the first direction, the fifteenth portion having a seventh minimum diameter, the fourth region continuously decreasing in diameter from the thirteenth portion to the fifteenth portion, the fourth region continuously decreasing in diameter from the fourteenth portion to the fifteenth portion, and the thirteenth and fourteenth portions defining a seventh distance therebetween in the first direction;
- a fifth region including a sixteenth portion, a seventeenth portion and an eighteenth portion, the sixteenth portion having a ninth maximum diameter, the seventeenth portion having a tenth maximum diameter, the eighteenth portion being provided between the sixteenth and seventeenth portions in the first direction, the eighteenth portion being provided on each of the sixteenth and seventeenth portions in the first direction, the eighteenth portion having an eighth minimum diameter, the fifth region continuously decreasing in diameter from the sixteenth portion to the eighteenth portion, the fifth region continuously decreasing in diameter from the seventeenth portion to the eighteenth portion, and the sixteenth and seventeenth portions defining an eighth distance therebetween in the first direction; and
- a sixth region provided between the fourth and fifth regions in the first direction and including a nineteenth portion, a twentieth portion and a twenty-first portion, the nineteenth portion having an eleventh maximum diameter, the twentieth portion having a twelfth maximum diameter, the twenty-first portion being provided between the nineteenth and twentieth portions in the first direction, the twenty-first portion being provided on each of the nineteenth and twentieth portions in the first direction, the twenty-first portion having a ninth minimum diameter, the sixth region continuously decreasing in diameter from the nineteenth portion to the twenty-first portion, the sixth region continuously decreasing in diameter from the twentieth portion to the twenty-first portion, the nineteenth and twentieth portions defining a ninth distance therebetween in the first direction, and the ninth distance being shorter than each of the seventh and eighth distances.

13. The method according to claim 9, wherein the at least one first pillar includes:
- a first plurality of pillars arranged at regular intervals along the first surface or the second surface, and
- a second plurality of pillars arranged at irregular intervals along the first surface or the second surface.

14. The method according to claim 9, wherein the insulating layer contains aluminum oxide.

15. The method according to claim 9, wherein the first element is a read element, and the second element is a write element.

16. The method according to claim 9, wherein the first element is a magnetoresistive effect element, and the second element is wiring that generates a magnetic field when current flows therethrough.

* * * * *